United States Patent
Ito

(10) Patent No.: US 6,693,822 B2
(45) Date of Patent: Feb. 17, 2004

(54) MAGNETIC RANDOM ACCESS MEMORY

(75) Inventor: Hiroshi Ito, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 25 days.

(21) Appl. No.: 09/987,979

(22) Filed: Nov. 16, 2001

(65) Prior Publication Data

US 2002/0080643 A1 Jun. 27, 2002

(30) Foreign Application Priority Data

Dec. 25, 2000 (JP) ........................................ 2000-393200

(51) Int. Cl.⁷ .............................................. G11C 11/00
(52) U.S. Cl. ................... 365/158; 365/230.06; 365/157
(58) Field of Search ............................ 365/158, 230.06, 365/157, 173, 171

(56) References Cited

U.S. PATENT DOCUMENTS

| | | | |
|---|---|---|---|
| 6,163,426 A | | 12/2000 | Nepela et al. |
| 6,178,131 B1 | * | 1/2001 | Ishikawa et al. .......... 365/225.7 |
| 6,215,707 B1 | * | 4/2001 | Moyer .................... 365/189.07 |
| 6,404,673 B1 | * | 6/2002 | Matsui ........................ 365/173 |
| 6,473,335 B2 | * | 10/2002 | Bohm et al. ................. 365/158 |
| 2002/0001225 A1 | | 1/2002 | Poechmueller |

OTHER PUBLICATIONS

R. Scheuerlein, et al., "A 10ns Read and Write Non–Volatile memory Array Using a Magnetic Tunnel Junction and FET Switch in each Cell", 2000 IEEE International Solid–State Circuits Conference, pp. 128–129.

M. Durlam, et al., "Nonvolatile RAM based on Magnetic Tunnel Junction Elements", 2000 IEEE International Solid–State Circuits Conference, pp. 130–131.

* cited by examiner

*Primary Examiner*—Michael S. Lebentritt
*Assistant Examiner*—Nam Nguyen
(74) *Attorney, Agent, or Firm*—Banner & Witcoff, Ltd.

(57) ABSTRACT

In an MRAM, a current with high current density flows in a line in write operation. When write operation is to be performed with respect to a memory cell existing at the intersection of a write word line and a bit line, a current flows in the write word line from a WWL driver to a voltage down converter. Thereafter, a current flows in the write word line in a direction opposite to the direction of the current flowing in the write operation, i.e., from the voltage down converter to the WWL driver. The same applies to a bit line. For example, after write operation, a current flows in the bit line in a direction opposite to the direction of a current flowing in the write operation.

23 Claims, 5 Drawing Sheets x: MAGNETIZATION EASY AXIS DIRECTION

MAGNETIC RANDOM ACCESS MEMORY

CROSS-REFERENCE TO RELATED APPLICATIONS

This application is based upon and claims the benefit of priority from the prior Japanese Patent Application No. 2000-393200, filed Dec. 25, 2000, the entire contents of which are incorporated herein by reference.

BACKGROUND

The present invention relates to a magnetic random access memory and, more particularly, to a technique of improving the reliability of a line through which a large current flows in write operation.

As researchers have recently found that an MTJ (Magnetic Tunnel Junction) has a high MR (Magneto-Resistive) ratio at room temperature, the implementation of an MRAM to which a TMR (Tunneling Magneto-Resistive) effect is applied seems to be feasible.

Before the application of the TMR effect to an MRAM, an MRAM to which a GMR (Giant Magneto-Resistance) effect is applied has been known. However, the MR ratio of an MRAM to which the GMR effect is applied is several % to about 10%. In addition, in the MRAM to which the GMR effect is applied, a current flows in a thin metal film having a low resistance, as a result, the signal level is as low as several mV.

The MRAM to which the GMR effect is applied uses a technique of canceling out variations in characteristics among a plurality of magneto-resistance elements (memory cells) to prevent a data read error due to a very low signal level. Conventionally, for example, data read operation is performed twice with respect to a single memory cell to prevent the effect of variation in characteristics among magneto-resistance elements. It is therefore difficult to realize high-speed read operation in the MRAM to which the GMR effect is applied.

When a memory cell is comprised of a GMR element and a MOS transistor as a switch, if the ON resistance of the MOS transistor is not sufficiently low, a signal (cell data) read out from the memory cell may be lost due to the influence of variations in the characteristics of MOS transistor.

In order to prevent such a phenomenon, the ON resistance of the MOS transistor in the memory cell may be decreased to a value almost equal to that of the GMR element. To decrease the ON resistance of the MOS transistor in the memory cell to a value almost equal to that of the GMR element, however, the MOS transistor needs to have a considerably large size. This makes it difficult to attain a large memory capacity by decreasing the memory cell size.

As described above, in a GMR and MRAM, it is very difficult to realize high-speed memory operation and a large memory capacity. For this reason, the GMR and MRAM are used only under special environments, e.g., in space, owing to their characteristic feature, i.e., having excellent radiation resistance, but are not generally used much.

The basic structure of a TMR element is the MTJ structure in which an insulating film is sandwiched between two ferromagnetic layers. A magnetic member has a direction in which magnetization tends to be oriented, i.e., a magnetization easy axis. When a magnetic field is applied to a device in a specific direction during deposition of a ferromagnetic layer, the magnetization easy axis of each memory cell coincides with the specific direction.

The magnetization easy axis direction is the direction in which the internal energy in the magnetic layer is minimized when the direction coincides with the magnetization direction. If, therefore, no external magnetic field is applied, the magnetization of the ferromagnetic layer of the TMR element is oriented in the magnetization easy axis direction, and the relative directions of the magnetization of the two ferromagnetic layers are set in two different states, i.e., parallel and anti-parallel.

The TMR element changes in resistance depending on whether the magnetization directions of the two ferromagnetic layers are parallel or anti-parallel. It is generally assumed that this change is based on the spin dependence of tunneling probability.

As described above, binary data can be stored depending on whether the magnetization directions of the ferromagnetic layers of the TMR element are parallel or anti-parallel. In addition, cell data can be read out by using a change in the resistance of the TMR element due to a magnetization state.

The MR ratio of an MRAM using the TMR effect is several ten %, and a resistance value for the TMR element can be selected from a wide range of resistance values by changing the thickness of the insulating layer (tunnel insulating film) sandwiched between the two magnetic layers. In addition, in the MRAM using the TMR effect, the signal level in read operation may become equal to or more than the signal level in the DRAM.

In the MRAM using the TMR effect, write operation is performed by changing the magnetization direction of the TMR element (making it parallel or anti-parallel) using the magnetic field generated by currents flowing in two lines (line word line and bit line) perpendicular to each other.

More specifically, if the two ferromagnetic layers are made to have different thicknesses to set a difference between the coercive forces of the two magnetic layers, the relative directions of magnetization of the two ferromagnetic layers can be made parallel or anti-parallel by arbitrarily reversing only the magnetization of the thinner magnetic layer (having lower coercive force). In addition, if a diamagnetic layer is added to one of the two ferro-magnetic layers, and the magnetization direction of the magnetic layer to which the diamagnetic layer is added is fixed by exchange coupling, the relative directions of magnetization of the two ferromagnetic layers can be made parallel or anti-parallel by arbitrarily reversing only the magnetization of the magnetic layer to which the diamagnetic layer is not added.

A magnetic layer has the following property. Assume that the magnetization of the magnetic layer is to be reversed by applying a magnetic field in a direction opposite to the magnetization direction of the magnetic layer. In this case, if a magnetic field is applied in advance in a direction perpendicular to the magnetization direction, the magnitude of a magnetic field (reversing magnetic field) required to reverse the magnetization of the magnetic layer can be reduced.

By using two lines perpendicular to each other and applying magnetic fields in two directions perpendicular to each other, only the magnetization of the memory cell at the intersection of the lines can be selectively reversed.

FIG. 1 shows an asteroid curve.

The asteroid curve represents the magnitude of a magnetic field whose magnetization is reversed when a magnetic field parallel to the magnetization easy axis direction and a magnetic field perpendicular to the magnetization easy axis direction are applied at once.

In this case, the magnetization easy axis direction is the x direction.

Magnetization reversal does not occur unless the distal end of a magnetic field vector exceeds the asteroid curve. The three vectors shown in FIG. 1 represent the vectors of magnetic fields generated in the first memory cell area located at the intersection of two lines through which write currents flow and the second memory area adjacent to the first memory cell area.

If the magnitudes of currents flowing in two lines are controlled such that the distal ends of magnetic field vectors generated in the adjacent first and second memory cell areas fall within the asteroid curve, and the distal end of the resultant vector falls outside the asteroid curve, data can be selectively written in only the memory cell located at the intersection of the two lines in which the write currents flow.

A reversed magnetic field has the property of increasing in inverse proportion to the width of a magnetic member.

If, therefore, the memory cell size is decreased to increase the memory capacity, the width of the magnetic member decreases, and the reversed magnetic field must be increased. As a result, a larger current is required to generate a reversed magnetic field. On the other hand, with a reduction in memory cell size, the line width decreases, and hence the current density abruptly increases.

As the memory cell size decreases, an electromigration (EM) phenomenon tends to occur due to a large current required to generate a reversed magnetic field, resulting in a deterioration in line reliability.

If, for example, the aspect ratio of a line cross section is increased and the thickness of a line is increased to decrease the current density, the ratio of current components flowing far from a magnetic layer to the current flowing in the line increases. As a consequence, magnetic fields immediately below and above the line decrease in intensity. To compensate for this, a sufficiently large current must be supplied to the line. That is, this measure is not an effective means for preventing the occurrence of an electromigration phenomenon.

In addition, if the line thickness increases, the attenuation ratio of a magnetic field at a line adjacent to a line in which a large current flows decreases. This means that the interference of a write magnetic field with the adjacent cell (unselected cell) increases. That is, since reversed magnetic fields vary depending on memory cells, if the line thickness increases, the probability of write errors with respect to unselected cells increases.

As described above, according to the prior art, to prevent the occurrence of an electromigration phenomenon and improve the reliability of interconnections, for example, the use of the means of increasing the interconnection thickness has been considered. This means, however, cannot sufficiently decrease the current density of the interconnection. In order to prevent a write error with respect to an unselected cell, only the thickness of an interconnection is minimized, and the intensity distribution of the magnetic field generated by a large current flowing in the interconnection must be made as steep as possible with a minimum distribution width.

In other words, in the conventional MRAM, it is impossible to simultaneously satisfy the following requirements, an increase in memory capacity with a decrease in memory cell size, an improvement in the reliability of an interconnection, and prevention of write errors.

SUMMARY

A magnetic random access memory according to an aspect of the present invention comprising a write word line, a bit line crossing the write word line, a magneto-resistance element which is placed at an intersection of the write word line and the bit line and stores data in accordance with a direction of magnetization that changes depending on a magnetic field generated by a current flowing in the write word line and a current flowing in the bit line, and a driver for causing the magneto-resistance element to store data by making a current flow in the write word line in a first direction, and then making a current flow in the write word line in a second direction.

DETAILED DESCRIPTION

A magnetic random access memory according to an aspect of the present invention will be described in detail below with reference to the views of the accompanying drawing.

In the magnetic random access memory according to the present invention, after write operation is complete, currents are respectively supplied to a write word line and bit line in directions opposite to the directions of currents that flowed in the write operation. The current values of these currents flowing in the opposite directions are equal to those of the currents that flowed in the write operation.

When currents are supplied in the opposite directions, the period during which a current is supplied to the write word line in the opposite direction is shifted from the period during which a current is supplied to the bit line in the opposite direction so as not to change the magnetization of a magneto-resistance element. The direction of a current flowing in the write word line does not depend on the magnetization direction (the value of data to be written in the memory cell), and hence can be changed for every write cycle.

With this operation, currents do not always flow in only one direction but flow in opposite directions uniformly in write operation. This makes it possible to prevent the occurrence of an electromigration phenomenon (in which electrons that form a current collide with atoms that form a metal line, and the atoms drift upon reception of kinetic momenta from the electrons, resulting in damage to the metal line or disconnection).

First Embodiment

Figure 2:
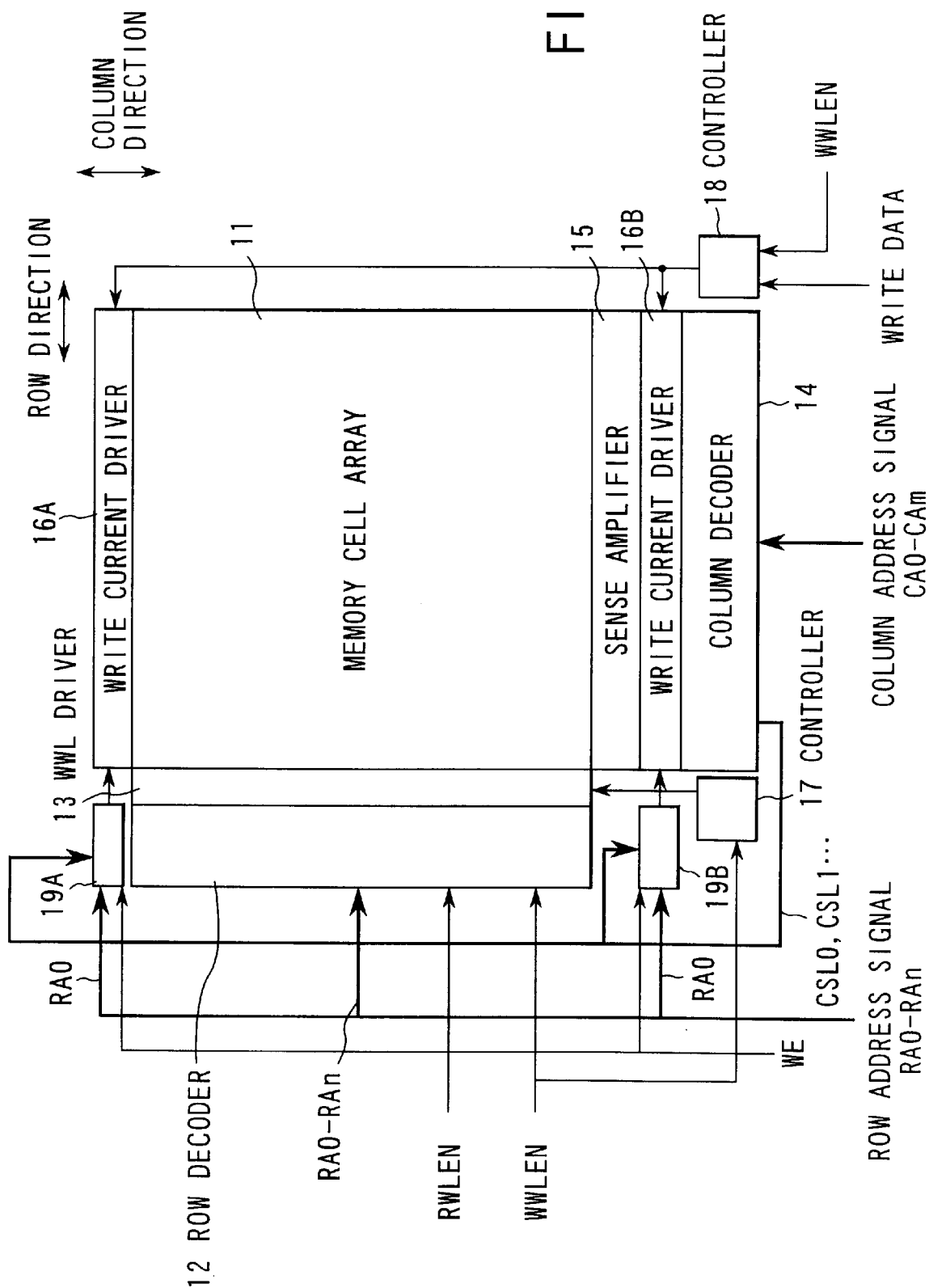
FIG. 2 is a block diagram showing the main part of an MRAM according to the first embodiment of the present invention.

FIG. 2 shows the main part of a magnetic random access memory according to the first embodiment of the present invention.

A row decoder 12 is placed on an end portion of a memory cell array 11 in the row direction. A row address signal RA0-RAn is input to the row decoder 12. The row decoder 12 is activated when a write word line enable signal WWLEN or read word line enable signal RWLEN is enabled.

In write operation, the row decoder 12 selects a write word line (row) WWL of the memory cell array 11 on the basis of the row address signal PA0-RAn. The write word line WWL and a bit line BL (to be described later) serve to make the magnetization directions of the two magnetic layers of a memory cell parallel or anti-parallel. A WWL driver 13 drives the selected write word line WWL.

A controller 17 is activated when the write word line enable signal WWLEN is enabled. The controller 17 is formed by, for example, a reset down trigger D-FF (Delay Flip-Flop) circuit and is made to function as a 1-bit counter by feeding back an inverted output to the input terminal.

The state of the reset down trigger D-FF circuit is determined in an initialization stage by a reset signal. For example, an output D of the reset down trigger D-FF circuit is inverted every time the write word line enable signal WWLEN falls.

An output signal from the reset down trigger D-FF circuit is supplied to the WWL driver 13.

In read operation, the row decoder 12 selects a read word line (row) RWL of the memory cell array 11 on the basis of the row address signal RA0-RAn. The read word line RWL serves to turn on a MOS transistor (switch) as an element of the selected memory cell in read operation.

A column address signal CA0-CAm is input to a column decoder 14. The column decoder 14 decodes the column address signal CA0-CAm and outputs column select signals CSL0, CSL1, •••.

The column select signals CSL0, CSL1, ••• are further input to bit line selectors 19A and 19B. In addition to the column select signals CSL0, CSL1, •••, a write enable signal WE and the least significant bit RA0 of the row address signal RA0-RAn are input to the bit line selectors 19A and 19B.

The bit line selectors 19A and 19B are activated when write operation is performed, i.e., the write enable signal WE is enabled.

In this embodiment, the bit line selectors 19A and 19B select a bit line on the basis of the least significant bit RA0 of the row address signal. This operation is performed because memory cells are laid out in a checkered pattern.

Output signals from the bit line selectors 19A and 19B are input to write current drivers 16A and 16B. The write current drivers 16A and 16B drive the selected bit line BL on the basis of the output signals from the bit line selectors 19A and 19B.

The direction in which a current flows in the bit line BL is controlled by a controller 18. The write word line enable signal WWLEN and write data DATA are input to the controller 18. When the write word line enable signal WWLEN is in the enabled state, the controller 18 controls the direction of a current flowing in the bit line BL on the basis of the value (binary value) of the write data DATA.

Similar to the controller 17, the controller 18 is formed by a reset down trigger D-FF (Delay Flip-Flop) circuit and is made to function as a 1-bit counter by feeding back an inverted output to the input terminal.

The state of the reset down trigger D-FF circuit is determined by a reset signal in an initialization stage. For example, an output D of the reset down trigger D-FF circuit is inverted every time the write word line enable signal WWLEN falls.

The controller 18 has a multiplexer MUX and changes the direction of a current flowing in the bit line BL by switching two outputs D and /D in accordance with the value of the write data DATA.

Figure 3:
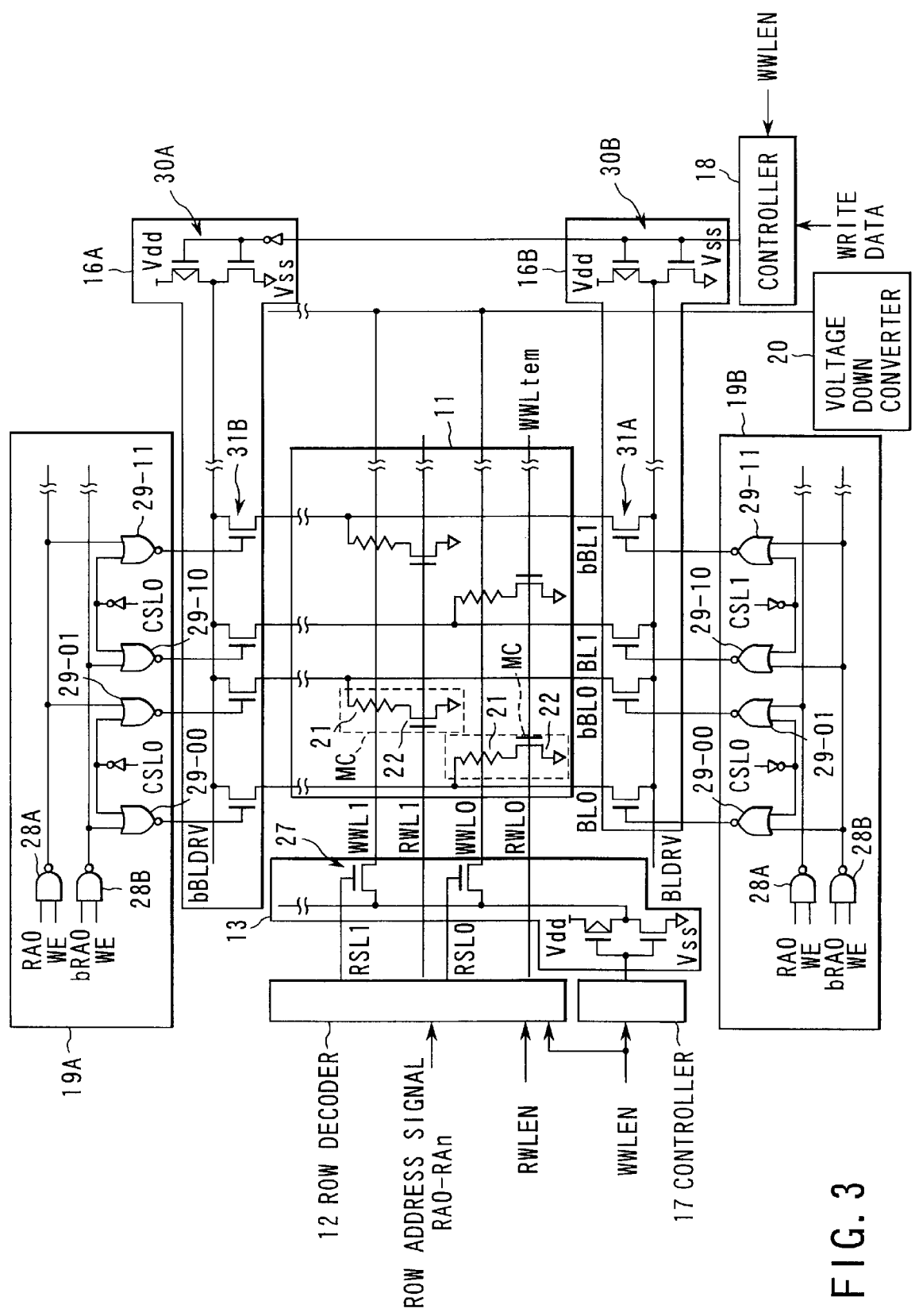
FIG. 3 is a circuit diagram showing the main part of the MRAM according to the first embodiment of the present invention.

FIG. 3 shows a concrete example of the circuit arrangement of the magnetic random access memory in FIG. 2. In FIG. 3, an illustration of a sense amplifier and column decoder for read operation is omitted.

The memory cell array 11 is comprised of a plurality of memory cells MC arranged in the form of an array. The memory cell MC is constituted by a TMR element 21 having an insulating layer sandwiched between two magnetic layers and a switch element 22 formed by a MOS transistor. One terminal of the TMR element 21 is connected to bit lines BL0, bBL0, BL1, bBL1, •••, and the TMR element 21 and switch element 22 are connected in series with each other between the bit lines BL0, bBL0, BL1, bBL1, ••• and a ground point.

Figure 1:
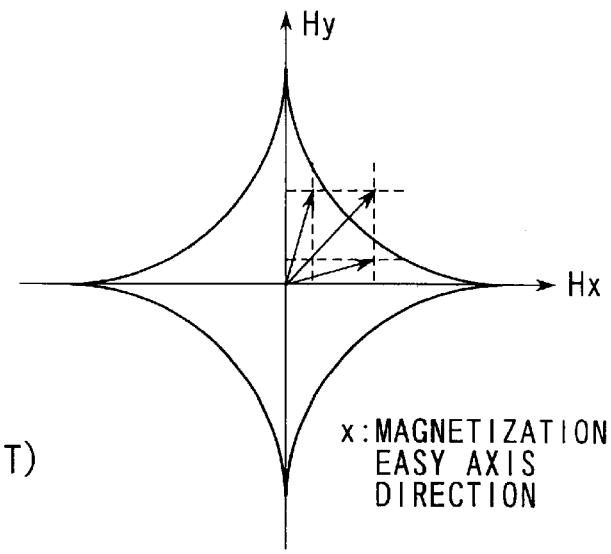
FIG. 1 is a graph showing an asteroid curve.
Figure 4:
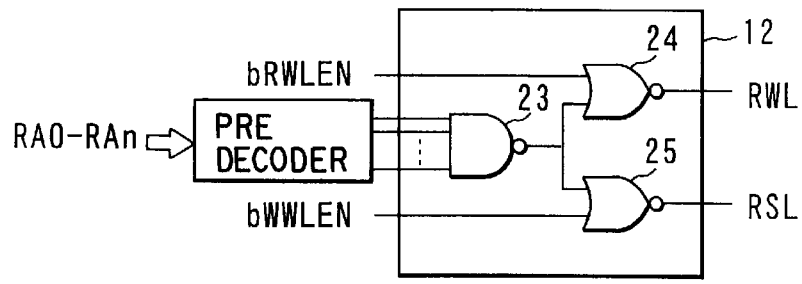
FIG. 4 is a circuit diagram showing a concrete example of a row decoder.

The row decoder 12 is arranged on an end portion of the memory cell array 11 in the row direction. The row decoder 12 is prepared for each row. For example, as shown in FIG. 4, the row decoder 12 is comprised of a NAND circuit 23 to which the row address signal RA0-RAn is input, a NOR circuit 24 to which the read word line enable signal RWLEN and inverted signal bRWLEN are input, and a NOR circuit 25 to which an inverted signal bWWLEN of the write word line enable signal WWLEN is input.

In write operation, all the input bits of the NAND circuit 23 are set in the "1" state in a row decoder corresponding to a selected row (write word line). At this time, since the write word line enable signal WWLEN is set in the enabled state (in which a pulse signal is output), the level of an output signal RSL from the NOR circuit 25 changes in accordance with the level of the inverted signal bWWLEN of the write word line enable signal WWLEN, and a period during which a write current is supplied to a selected write word line WWLi is determined.

In write operation, the read word line enable signal RWLEN is kept at "L" level (e.g., the ground potential), and the inverted signal bRWLEN of the read word line enable signal RWLEN is kept at "H" level. Therefore, an output signal RWL from the NOR circuit 24 is always kept at "L" level.

In read operation, all the input bits of the NAND circuit 23 are set in the "1" state in a row decoder corresponding to a selected row (read word line). In addition, at this time, since the inverted signal bRWLEN of the read word line enable signal RWLEN is set at "L" level, the output signal RWL from the NOR circuit 24 is set at "H" level.

In read operation, the write word line enable signal WWLEN is always kept at "L" level (e.g., the ground potential), and the inverted signal bWWLEN of the write word line enable signal WWLEN is always kept at "H" level. Therefore, the output signal RWL from the NOR circuit 25 is always kept at "L" level.

The WWL driver 13 is comprised of an inverter circuit 26 and an N-channel MOS transistor 27 serving as a transfer gate. The inverter circuit 26 outputs a write word line driver signal WWLDRV on the basis of an output signal from the controller 17. The write word line driver signal WWLDRV is transferred to write word lines WWL0, WWL1, ••• through the N-channel MOS transistor 27.

Output signals RSL0,••• RSL1, from the row decoder 12 (see FIG. 4) are input to the gate of the N-channel MOS transistor 27 serving as a transfer gate. Since only the transfer gate of the row selected by the row address signal RA0-RAn is set in the ON state, the WWL driver 13 drives only the selected write word line WWL.

If, for example, the word line WWL1 is selected by the row address signal RA0-RAn, the row decoder 12 sets the output signal (decode signal) RSL1 at "H" level. In write operation, therefore, the WWL driver 13 controls the direction of a current flowing in the write word line WWL1.

Figure 5:
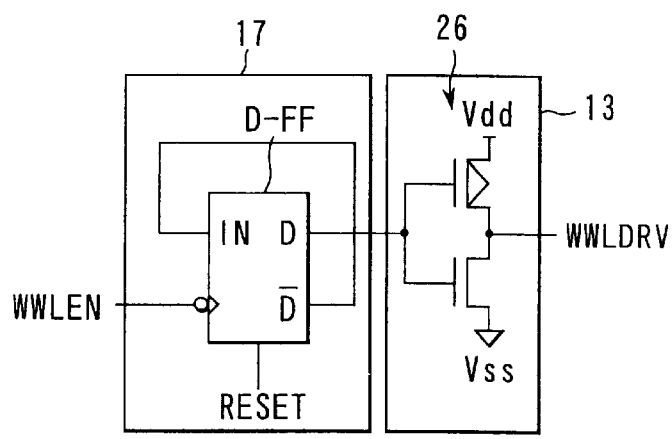
FIG. 5 is a circuit diagram showing a concrete example of a controller.
Figure 6:
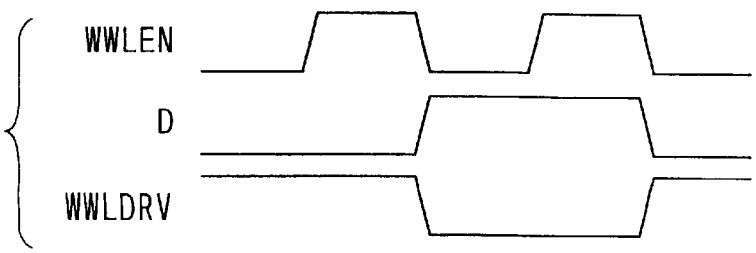
FIG. 6 is a timing chart showing the operation of the controller.

For example, as shown in FIG. 5, the controller 17 is comprised of a reset down trigger D-FF (Delay Flip-Flop) circuit. This D-FF circuit has an inverted output fed back to the input terminal and functions as a 1-bit counter. The state of the D-FF circuit is determined by a reset signal in an initialization stage. At this time, for example, as shown in FIG. 6, an output signal D from the D-FF circuit is inverted every time the write word line enable signal WWLEN falls.

The read word lines RWL0, RWL1, ••• are used to turn on the MOS transistor (switch) 22 as an element of the selected memory cell MC in read operation. In read operation, the row decoder 12 selects a row (read word line RWL) of the memory cell array 11 on the basis of the row address signal RA0-RAN.

The bit line selectors 19A and 19B are comprised of NAND circuits 28A and 28B and NOR circuits 29-00, 29-01, 29-10, 29-11, •••. The column select signals CSL0, CSL1,••• obtained by decoding the column address signal CA0-CAm are input to the NOR circuits 29-00, 29-01, 29-10, 29-11, •••.

In write operation, the write enable signal WE is set at "H" level, and for example, one of the column select signals CSL0, CSL1,••• is set at "H" level. In this embodiment, the bit line selectors 19A and 19B select a bit line on the basis of the least significant bit RA0 of the row address signal.

For example, assume that the column select signal CSL0 is at "H" level, and the least significant bit RA0 of the row address signal is at "L (=0)" level. In this case, an output signal from the NAND circuit 28A is set at "H" level, an output signal from the NAND circuit 28B is set at "L" level, and an output signal from the NOR circuit 29-00 in each of the bit line selectors 19A and 19B is set at "H" level. As a result, the direction of a current flowing in the bit line BL0 is controlled by the write current drivers 16A and 16B.

In this embodiment, when the least significant bit RA0 of the row address signal is set at "L (=0)" level, one of even-numbered write word lines WWLj (j is 0, 2, •••) is selected. At this time, one of the bit lines BL0, BL1,••• is selected. When the least significant bit RA0 of the row address signal is set at "H (=1)" level, one of odd-numbered write word lines WWLk (k is 1, 3, •••) is selected. At this time, one of the bit lines bBL0, bBL1, ••• is selected.

The write current drivers 16A and 16B are comprised of inverter circuits 30A and 30B and N-channel MOS transistors 31A and 31B serving as transfer gates. The inverter circuits 30A and 30B output bit line drive signals BLDRV and bBLDRV on the basis of an output signal from the controller 18. The bit line drive signals BLDRV and bBLDRV are transferred to the bit lines BL0, bBL0, BL1, and bBL1 through the N-channel MOS transistors 31A and 31B.

Output signals from the bit line selectors 19A and 19B are input to the gates of the N-channel MOS transistors 31A and 31B serving as transfer gates. Therefore, only the transfer gate of the column selected by the column address signal CA0-CAm and the least significant bit RA0 of the row address signal is turned on. As a consequence, the write current drivers 16A and 16B drive only the selected bit line BL.

If, for example, the bit line BL0 is selected by the column address signal CA0-CAm and the least significant bit RA0, an output signal (decode signal) from the NOR circuit 29-00 in each of the bit line selectors 19A and 19B is set at "H" level. In write operation, therefore, the direction of a current flowing in the bit line BL0 is controlled by the write current drivers 16A and 16B.

Figure 7:
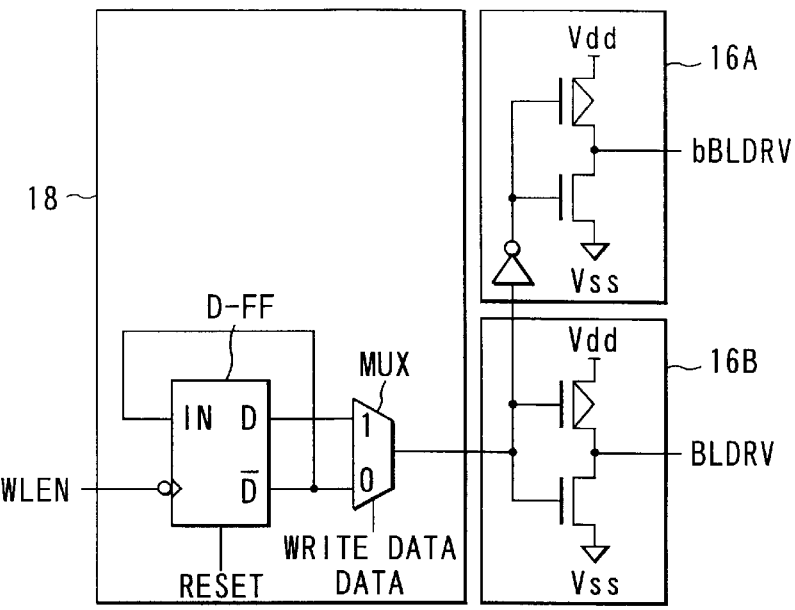
FIG. 7 is a circuit diagram showing a concrete example of the controller.

For example, as shown in FIG. 7, the controller 18 is formed by a reset down trigger D-FF (Delay Flip-Flop) circuit. This D-FF circuit has an inverted output fed back to the input terminal and functions as a 1-bit counter. The state of the D-FF circuit is determined by a reset signal in an initialization stage. The controller 18 has the multiplexer MUX and changes the direction of a current flowing in the bit line BL by switching two outputs D and /D in accordance with the value of the write data DATA (selects the output D when DATA="1", and the output /D when DATA ="0").

Figure 8:
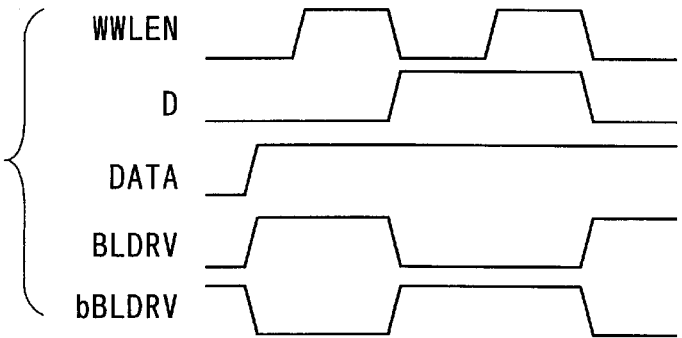
FIG. 8 is a timing chart showing the operation of the controller.

As shown in FIG. 8, for example, the output signal D from the D-FF circuit is inverted every time the write word line enable signal WWLEN falls.

A characteristic feature of the operation of the magnetic random access memory (FIG. 3) according to an aspect of the present invention will be described next with reference to FIG. 9.

Figure 9:
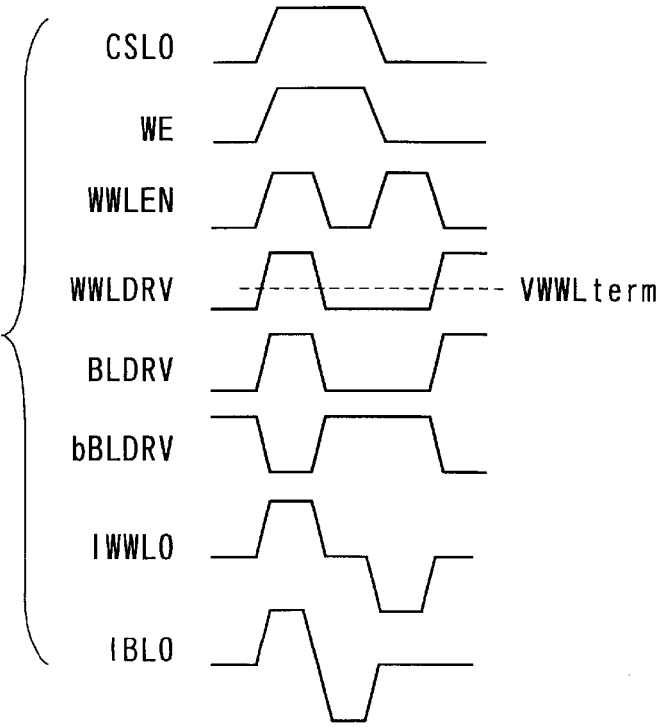
FIG. 9 is a timing chart showing the operation of the MRAM according to the first embodiment of the present invention.

Referring to the timing chart of FIG. 9, the ordinates of signals IWWL0 and IBL0 represent currents, and the ordinates of the remaining signals represent voltages.

The present operation is characterized in write operation.

For the sake of simplicity, consider a case where data is written in the memory cell MC existing at the intersection of the write word line WWL0 and the bit line BL0. Assume that the write data DATA is "1", and an initial state (a state immediately after the write enable signal WE is set at "H" level) is set such that the write word line driver signal WWLDRV is at "H" level, and the bit line driver signals BLDRV and bBLDRV are at "H" level and "L" level, respectively.

First of all, the write enable signal WE is set at "H" level, and the memory enters into the write mode. In addition, the write word line enable signal WWLEN is set at "H" level, the column select signal CSL0 is set "H" level, and the remaining column select signals CSL1, . . . are maintained at "L" level.

When the row address signal RA0-RAN is decoded by the row decoder 12, the output signal RSL0 from the row decoder 12 is set at "H" level to turn on the N-channel MOS transistor (transfer gate) 27 connected to the write word line WWL0.

At this time, the output signals RSL1, ••• from the row decoder 12 are set at "L" level, and hence the N-channel MOS transistors (transfer gates) 27 connected to unselected write word lines WWL1, ••• are turned off. In addition, since the output signals RWL0, RWL1, ••• from the row decoder 12 are set at "L" level, the N-channel MOS transistor 22 in the memory cell MC is also turned off.

An output signal from the controller 17 is at "L" level, and the write word line driver signal WWLDRV is at "H" level (e.g., Vdd). In addition, a signal VWWLterm is at a predetermined level (a predetermined value between "H" and "L" of WWLDRV). As a consequence, a current flows in the write word line WWL0 from the WWL driver 13 to a voltage down converter 20 (this direction of a current is assumed to be a positive direction).

In addition, since the column select signal CSL0 is at "H" level, and a signal bRA0 is at "H" level, the N-channel MOS transistors (transfer gates) 31A and 31B connected to the bit line BL0 are turned on.

When the write data DATA is "1", an output signal from the controller 18 is set at "L" level. At this time, the bit line driver signal BLDRV is set at "H" level (e.g., Vdd), and the bit line driver signal bBLDRV is set at "L" level (e.g., Vss). As a consequence, a current flows in the bit line BL0 from the write current driver 30B to the write current driver 30A (this direction of a current is assumed to be a positive direction).

Note that when the write data DATA is "0", an output signal from the controller 18 is set at "H" level. At this time, the bit line driver signal BLDRV is set at "L" level (e.g., Vss), and the bit line driver signal bBLDRV is set at "H" level (e.g., Vdd).

As a result, a current flows in the bit line BL0 from the write current driver 30A to the write current driver 30B (this direction of a current is assumed to be a negative direction).

As described above, since the direction of a current flowing in the bit line BL0 changes in accordance with the write data DATA, the magnetic field generated by the current IWWL0 flowing in the write word line WWL0 and the current IBL0 flowing in the bit line BL0 is changed in accordance with the direction of the current IBL0 flowing in the bit line BL0, thereby writing write data in the memory cell MC at the intersection of the write word line WWL0 an the bit line BL0.

When the write word line enable signal WWLEN changes from "H" level to "L" level afterward, the output signals from the controllers 17 and 18 change from "L" level to "H" level (as shown in FIGS. 5 to 8, the output level of the D-FF is triggered to change by the trailing edge of the write word line enable signal WWLEN. In addition, the write data DATA remains "1").

The write word line driver signal WWLDRV is therefore set at "L" level, and the current IWWL0 flowing in the write word line WWL0 is stopped.

When the output signal from the controller 18 is set at "H" level, the levels of the bit line driver signals BLDRV and bBLDRV are inverted. For this reason, a current flows in the bit line BL0 in a direction opposite to the direction of a current flowing in write operation.

In this embodiment, the write data DATA is assumed to be at "1". For this reason, as indicated by the timing chart of FIG. 9, a current flows in the bit line BL0 in the positive direction during the execution of write operation. After the write operation is complete, a current flows in the bit line BL0 in the negative direction.

As described above, according to this embodiment, in write operation, immediately after data is completely written in the memory cell MC, a current flows in the selected bit line BL0 in a direction opposite to the direction of a current flowing in the bit line BL0 during the execution of data write operation.

According to this embodiment, therefore, currents in the opposite directions always flow in the bit line BL0 uniformly, but it never happens that only currents in the same direction flow. This makes it possible to suppress the occurrence of electromigration in a bit line, thereby providing a highly reliable magnetic random access memory.

Note that a current in the direction opposite to the direction of a current in write operation flows in the bit line BL0 after write operation, and no current flows in the write word line WWL0 after write operation. For this reason, when a reverse current flows in the bit line BL0, the data written in the memory cell MC is not destroyed.

When an appropriate period of time has elapsed after a reverse current flows in the bit line BL0, the level of the column select signal CSL0 changes from "H" level to "L" level. As a consequence, the N-channel MOS transistor (transfer gate) connected to the bit line BL0 is turned off to stop the reverse current.

When the write word line enable signal WWLEN changes from "L" level to "H" level again after this operation, since the write word line driver signal WWLDRV is at "L" state (the write word line driver signal WWLDRV changes in response to the trailing edge of the write word line enable signal WWLEN), a current flows in the write word line WWL0 from the voltage down converter 20 to the WWL driver 13 (this direction of a current is assumed to a negative direction).

As described above, according to this embodiment, in write operation, after data is completely written in the memory cell MC, a current in a direction opposite to the direction of a current flowing in the selected write word line WWL0 during write operation flows in the selected write word line WWL0.

According to this embodiment, therefore, currents in the opposite directions always flow in the write word line WWL0 uniformly, but it never happens that only currents in the same direction flow. This makes it possible to suppress the occurrence of electromigration in a write word line, thereby providing a highly reliable magnetic random access memory.

Note that as indicated by, for example, the timing chart of FIG. 9, the level (e.g., the fixed value) of the signal VWWLterm is controlled by the voltage down converter 20 to keep the current value of IWWL0 constant regardless of the direction of IWLL0.

When the write word line enable signal WWLEN changes from "H" level to "L" level afterward, the output signal from the controller 17 changes from "H" level to "L" level (as shown in FIGS. 5 to 8, the output level of the D-FF is triggered to change by the trailing edge of the write word line enable signal WWLEN. In addition, the write data DATA remains "1").

Therefore, the write word line driver signal WWLDRV is set at "H" level, and the bit line driver signals BLDRV and bBLDRV are set at "H" level and "L" level, respectively, thus restoring the initial state.

Referring to the timing chart of FIG. 9, the pulse width of a pulse signal supplied to the write word line WWL0 and bit line BL0 in write operation is substantially equal to the pulse width of a pulse signal supplied to the write word line WWL0 and bit line BL0 when a reverse current is made to flow.

On condition that sufficient line reliability that can satisfy the specifications of a product can be ensured, the pulse width of a pulse signal in supplying a reverse current may be smaller than the pulse width of a pulse signal in write operation.

Second Embodiment

A magnetic random access memory (MRAM) is capable of randomly writing data in an arbitrary bit in the memory cell array. In this case, as a technique of increasing the write bandwidth, for example, a technique of fixing a row address, and writing data in memory cells exiting at the intersections of the row designated by the row address and a plurality of columns is known.

In an MRAM, it is not preferable that data be simultaneously written in all columns at once, because a large write current is required, resulting in a shortage of peak currents supplied and adverse effects such as radiation of electromagnetic waves.

In this case, write operation is not simultaneously performed for all columns, and, for example, column select signals CSLi for selecting columns are sequentially input with time shifts to execute data write operation for memory cells column by column.

Figure 10:
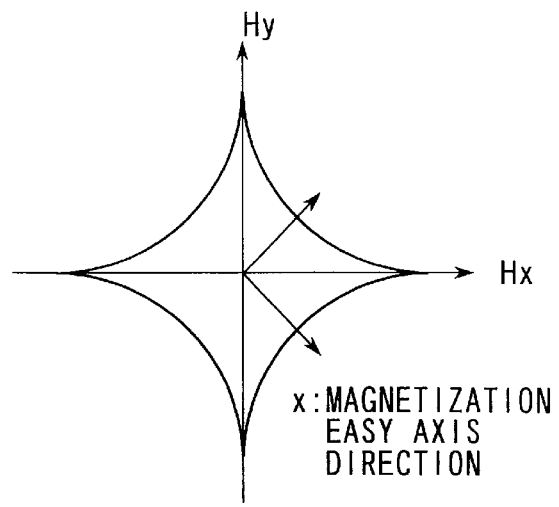
FIG. 10 is a graph showing an asteroid curve.

As is obvious from the asteroid curve of FIG. 10, when the magnetization of a memory cell is to be reversed, magnetic field components in a direction perpendicular to the magnetization easy axis direction may be generated in either the positive direction or the negative direction. This means that write operation can be performed even in a period during which a reverse current flows.

If, therefore, the direction of a write current flowing in a write word line is inverted every column cycle, since currents in the opposite directions alternately flow in the write word line for each write operation, there is no need to newly set a reverse current period during which no write operation is performed. This makes it possible to efficiently use power and improve the reliability of each line.

Figure 11:
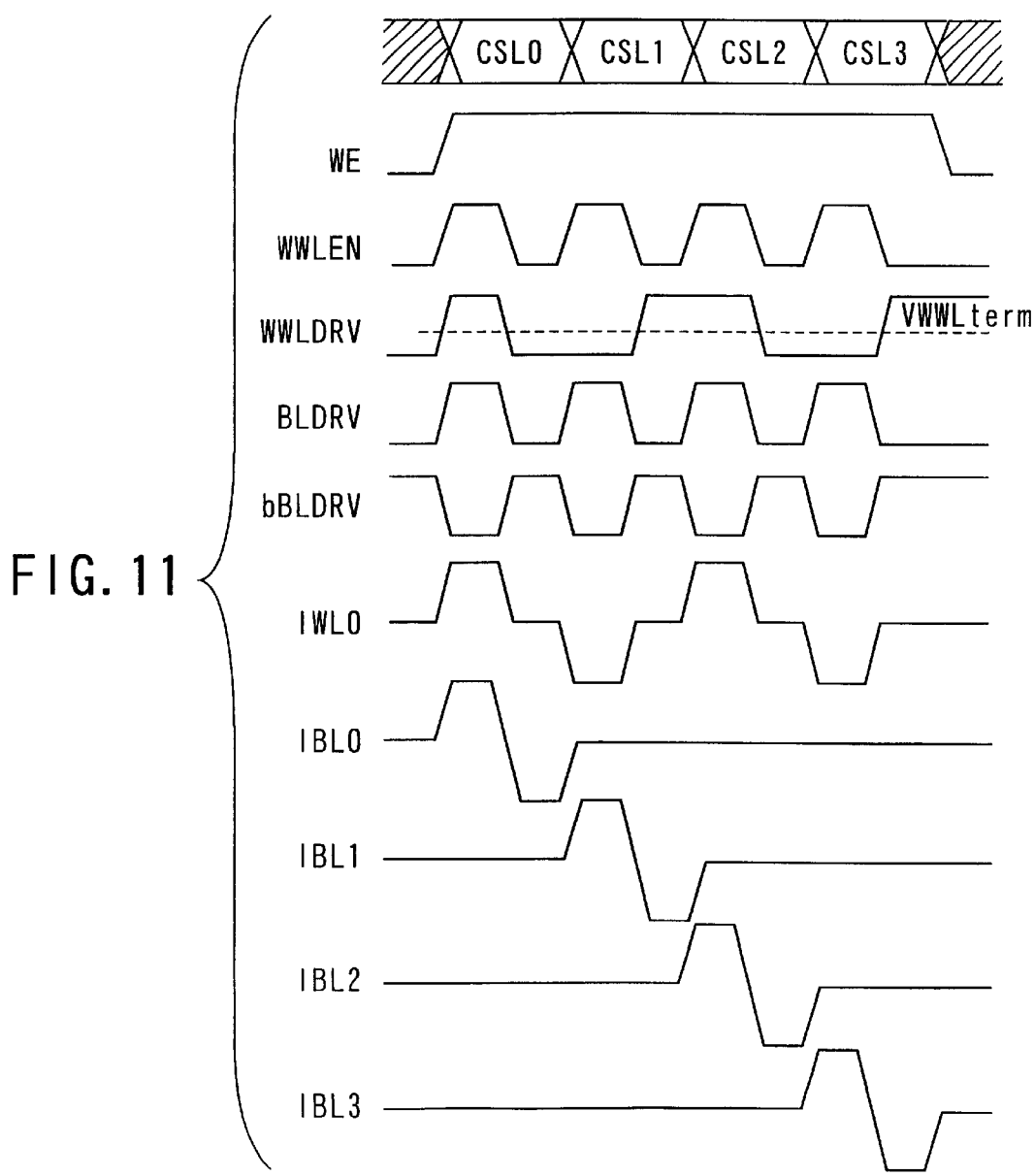
FIG. 11 is a timing chart showing the operation of an MRAM according to the second embodiment of the present invention.

FIG. 11 shows a concrete example of currents flowing in a write word line and bit line during write operation.

Referring to the timing chart of FIG. 11, the ordinates of signals IWWL0 and IBL0 represent currents, and the ordinates of the remaining signals represent voltages.

Consider a case where data are sequentially written in memory cells MC existing at the intersections of a write word line WWL0 and bit lines BL0, BL1, BL2, and BL3.

First of all, a write enable signal WE is set at "H" level, and the memory enters into the write mode. In addition, a write word line enable signal WWLEN is set at "H" level, a column select signal CSL0 is set "H" level, and the remaining column select signals CSL1, ••• are maintained at "L" level.

When a row address signal RA0-RAn is decoded by a row decoder 12, an output signal RSL0 from the row decoder 12 is set at "H" level to turn on an N-channel MOS transistor (transfer gate) 27 connected to the write word line WWL0.

At this time, output signals RSL1, from the row decoder 12 are set at "L" level, and hence an N-channel MOS transistors (transfer gates) 27 connected to unselected write word lines WWL1, are turned off. In addition, since output signals RWL0, RWL1, from the row decoder 12 are set at "L" level, an N-channel MOS transistor 22 in the memory cell MC is also turned off.

An output signal from a controller 17 is at "L" level, and a write word line driver signal WWLDRV is at "H" level (e.g., Vdd). In addition, a signal VWWLterm is at a predetermined level (a predetermined value between "H" and "L" of WWLDRV). As a consequence, a current flows in the write word line WWL0 from a WWL driver 13 to a voltage down converter 20 (this direction of a current is assumed to be a positive direction).

In addition, since the column select signal CSL0 is at "H" level, and a signal bRA0 is at "H" level, N-channel MOS transistors (transfer gates) 31A and 31B connected to the bit line BL0 are turned on.

When write data DATA is "1", an output signal from a controller 18 is set at "L" level. At this time, a bit line driver signal BLDRV is set at "H" level (e.g., Vdd), and a bit line driver signal bBLDRV is set at "L" level (e.g., Vss). As a consequence, a current flows in the bit line BL0 from a write current driver 30B to a write current driver 30A (this direction of a current is assumed to be a positive direction).

Note that when the write data DATA is "0", an output signal from the controller 18 is set at "H" level. At this time, the bit line driver signal BLDRV is set at "L" level (e.g., Vss), and the bit line driver signal bBLDRV is set at "H" level (e.g., Vdd). As a result, a current flows in the bit line BL0 from the write current driver 30A to the write current driver 30B (this direction of a current is assumed to be a negative direction).

As described above, since the direction of a current flowing in the bit line BL0 changes in accordance with the write data DATA, the magnetic field generated by the current IWWL0 flowing in the write word line WWL0 and the current IBL0 flowing in the bit line BL0 is changed in accordance with the direction of the current IBL0 flowing in the bit line BL0, thereby writing write data in the memory cell MC at the intersection of the write word line WWL0 an the bit line BL0.

When the write word line enable signal WWLEN changes from "H" level to "L" level afterward, the output signals from the controllers 17 and 18 change from "L" level to "H" level. The write word line driver signal WWLDRV is therefore set at "L" level, and the current IWWL0 (positive direction) flowing in the write word line WWL0 is stopped.

When the output signal from the controller 18 is set at "H" level, the levels of the bit line driver signals BLDRV and bBLDRV are inverted. For this reason, a current flows in the bit line BL0 in a direction opposite to the direction of a current flowing in write operation.

In this embodiment, as indicated by the timing chart of FIG. 11, a current flows in the bit line BL0 in the positive direction during the execution of write operation. After the write operation is complete, a current flows in the bit line BL0 in the negative direction.

As described above, according to this embodiment, in write operation, immediately after data is completely written in the memory cell MC, a current flows in the selected bit line BL0 in a direction opposite to the direction of a current flowing in the bit line BL0 during the execution of data write operation.

According to this embodiment, therefore, currents in the opposite directions always flow in the bit line BL0 uniformly, but it never happens that only currents in the same direction flow. This makes it possible to suppress the occurrence of electromigration in a bit line, thereby providing a highly reliable magnetic random access memory.

Note that a current in the direction opposite to the direction of a current in write operation flows in the bit line BL0 after write operation, and no current flows in the write word line WWL0 after write operation. For this reason, when a reverse current flows in the bit line BL0, the data written in the memory cell MC is not destroyed.

When an appropriate period of time has elapsed after a reverse current flows in the bit line BL0, the level of the column select signal CSL0 changes from "H" level to "L"

level. As a consequence, the N-channel MOS transistor (transfer gate) connected to the bit line BL0 is turned off to stop the reverse current.

When the write word line enable signal WWLEN changes from "LI" level to "H" level again after this operation, since the write word line driver signal WWLDRV is at "L" state (the write word line driver signal WWLDRV changes in response to the trailing edge of the write word line enable signal WWLEN), a current flows in the write word line WWL0 from the voltage down converter 20 to the WWL driver 13 (this direction of a current is assumed to a negative direction).

The case shown in FIG. 11 differs from the case shown in FIG. 9 in the following point. In the case shown in FIG. 9, while such a current in the negative direction flows in the write word line WWL0, no write operation is performed. In contrast to this, in the case shown in FIG. 11, even while such a current in the negative direction flows in the write word line WWL0, write operation is performed for the memory cells on the next column (CSL1).

More specifically, when the write data DATA is at "1", an output signal from the controller 18 is set at "L" level. At this time, the bit line driver signal BLDRV is set at "H" level (e.g., Vdd). In addition, the bit line driver signal bBLDRV is set at "L" level (e.g., Vss). As a consequence, a current in the positive direction flows in the bit line BL1.

When the write data DATA is "0", the output signal from the controller 18 is set at "H" level. At this time, the bit line driver signal BLDRV is set at "L" level (e.g., Vss), and the bit line driver signal bBLDRV is set at "H" level (e.g., Vdd). As a result, a current in the negative direction flows in the bit line BL1.

As described above, since the direction of a current flowing in the bit line BL1 changes in accordance with the write data DATA, the magnetic field generated by the current IWWL0 flowing in the write word line WWL0 and the current IBL1 flowing in the bit line BL1 is changed in accordance with the direction of the current IBL1 flowing in the bit line BL1, thereby writing write data in the memory cell MC at the intersection of the write word line WWL0 an the bit line BL1.

Note that the direction of a current flowing in a write word line in write operation for a memory cell on the column CSL0 differs from the direction of a current flowing in a write word line in write operation for a memory cell on the column CSL1.

As is obvious from the asteroid curve of FIG. 10, the direction of a current flowing in a write word line is irrelevant to inversion of the magnetization of a memory cell. That is, magnetic field components in a direction perpendicular to the magnetization easy axis direction in magnetization reversal may be generated in either the positive direction or the negative direction. For this reason, no problem arises even if the directions of currents flowing in write word lines in write operation for memory cells on the respective columns CSL0, CSL1,••• differ from each other.

Subsequently, when the write word line enable signal WWLEN changes from "H" level to "L" level, the output signals from the controllers 17 and 18 change from "L" level to "H" level. As a consequence, the write word line driver signal WWLDRV is set at "H" level, and the current (negative direction) IWWL0 flowing in the write word line WWL0 is stopped.

When the output signal from the controller 18 is set at "H" level, the levels of the bit line driver signal BLDRV and bBLDRV are inverted. For this reason, a current flows in the bit line BL1 in a direction opposite to the direction of a current flowing in write operation.

In this case, as indicated by the timing chart of FIG. 11, in write operation, a current flows in the bit line BL1 in the positive direction. After the write operation, a current flows in the bit line BL1 in the negative direction.

When an appropriate period of time has elapsed after a reverse current flows in the bit line BL1, the level of the column select signal CSL1 changes from "H" level to "L" level. As a consequence, the N-channel MOS transistor (transfer gate) connected to the bit line BL1 is turned off to stop the reverse current.

Subsequently, the write word line enable signal WWLEN changes from "L" level to "H" level again. At this time, since the write word line driver signal WWLDRV is at "H" level, a current flows in the write word line WWL0 from the WWL driver 13 to the voltage down converter 20 (positive direction).

A current IBL2 in a direction corresponding to the write data DATA flows in the bit line BL2 of the column CSL2 to execute data write for the memory cell MC existing at the interconnection of the write word line WWL0 and the bit line BL2.

After the write operation for the memory cell MC on the column CSL2, write operation is executed for the memory cell MC on the column CSL3.

As described above, according to this embodiment, when, for example, write operation is performed in the order of the column CSL0, CSL1, •••, a current is made to flow in the write word line WWL0 in the positive direction in write operation for the memory cell MC on the column CSL0, whereas a current is made to flow in the write word line WWL0 in the negative direction in write operation for the memory cell MC on the column CSL1.

In write operation, it never happens that only currents in a predetermined direction flow in the write word line WWL0 in write operation, but currents in the opposite directions always flow alternately and uniformly. According to the present invention, therefore, the occurrence of electromigration in a write word line can be suppressed, and a highly reliable magnetic random access memory can be provided.

Note that the level (e.g., the fixed value) of the signal VWWLterm is controlled by the voltage down converter 20 to keep the current value of IWWL0 constant regardless of the direction of IWLL0, as indicated by, for example, the timing chart of FIG. 11.

As described above, according to this embodiment, when column select signals CSLi for selecting columns are to be sequentially input with time shifts to execute data write operation for memory cells column by column, the direction of a write current flowing in a write word line is reversed for each write operation (every time columns are switched). This makes it possible to efficiently use power and improve the reliability of each line.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
a write word line;

a bit line crossing said write word line;

a magneto-resistance element which is placed at an intersection of said write word line and said bit line and stores data in accordance with a direction of magnetization that changes depending on a magnetic field generated by a current flowing in said write word line and a current flowing in said bit line; and a driver for causing said magneto-resistance element to store data by making a current flow in said write word line in a first direction, and then making a current flow in said write word line in a second direction opposite to the first direction; and wherein while the current flows in said write word line in the second direction, the current flowing in said bit line is interrupted.

2. The memory according to claim 1, wherein a current value of the current flowing in said write word line in the first direction is equal to a current value of the current flowing in said write word line in the second direction.

3. The memory according to claim 1, wherein a direction of the current flowing in said write word line is controlled by fixing a potential of one end of said write word line and changing a potential of the other end of said write word line.

4. The memory according to claim 1, wherein said magneto-resistance element has a structure in which an insulating layer is sandwiched between two magnetic layers.

5. A magnetic random access memory comprising:

a write word line;

a bit line crossing said write word line;

a magneto-resistance element which is placed at an intersection of said write word line and said bit line and stores data in accordance with a direction of magnetization that changes depending on a magnetic field generated by a current flowing in said bit line; and a driver for causing said magneto-resistance element to store data by making a current flow in said bit line in a first direction, and then making a current flow in said bit line in a second direction opposite to the first direction; and wherein while the current flows in said bit line in the second direction, the current flowing in said write word line is interrupted.

6. The memory according to claim 5, wherein a current value of the current flowing in said bit line in the first direction is equal to a current value of the current flowing in said bit line in the second direction.

7. The memory according to claim 5, wherein a direction of the current flowing in said bit line is controlled by changing potentials of two ends of said bit line.

8. The memory according to claim 5, wherein said magneto-resistance element has a structure in which an insulating layer is sandwiched between two magnetic layers.

9. A magnetic random access memory comprising:

a write word line;

a bit line crossing said write word line;

a magneto-resistance element which is placed at an intersection of said write word line and said bit line and stores data in accordance with a direction of magnetization that changes depending on a magnetic field generated by a current flowing in said write word line and a current flowing in said bit line; and a driver for causing said magneto-resistance element to store data by making a current flow in said write word line in a first direction and making a current flow in said bit line in a second direction, and then making a current flow in said write word line in a third direction opposite to the first direction and making a current flow in said bit line in a fourth direction opposite to the second direction;

wherein a period during which the current flows in said write word line in the third direction is completely shifted in time from a period during witch the current flows in said bit line in the fourth direction.

10. The memory according to claim 9, wherein a current value of the current flowing in said write word line in the first direction is equal to a current value of the current flowing in said write word line in the third direction, and a current value of the current flowing in said bit line in the second direction is equal to a current value of the current flowing in said bit line in the fourth direction.

11. The memory according to claim 9, wherein a direction of the current flowing in said write word line is determined by changing a potential of at least one of two end portions of said write word line, and a direction of the current flowing in said bit line is determined by changing a potential of at least one of two end portions of said bit line.

12. The memory according to claim 9, wherein said magneto-resistance element has a structure in which an insulating layer is sandwiched between two magnetic layers.

13. A magnetic random access memory comprising:

a write word line;

bit lines crossing said write word line;

magneto-resistance elements which are placed one by one at intersections of said write word line and said bit lines and store data in accordance with directions of magnetization that change depending on magnetic fields generated by a current flowing in said write word line and currents flowing in said bit lines; and a driver for causing said magneto-resistance element located at an intersection of said write word line and a selected bit line of said bit lines to store data by making a current flow in said write word line in a first direction and making a current flow in said selected bit line in a second direction, and then making a current flow in said write word line in a third direction opposite to the first direction and making a current flow in said selected bit line in a fourth direction opposite to the second direction;

wherein a period during which the current flows in said write word line in the third direction is completely shifted in time from a period during which the current flows in said selected bit line in the fourth direction.

14. The memory according to claim 13, wherein data write operation is completed for said magneto-resistance element located at the intersection of said write word line and said selected bit line in one write cycle, and a direction of the current flowing in said write word line is changed for each write cycle.

15. The memory according to claim 13, wherein data write operation is completed for said magneto-resistance element located at the intersection of said write word line and said selected bit line in one write cycle, and a direction of the current flowing in said selected bit line is changed once within one write cycle.

16. The memory according to claim 13, wherein data to be written in said magneto-resistance element located at the intersection of said write word line and said selected bit line is determined by a direction of the current flowing in said selected bit line.

17. The memory according to claim 13, herein said magneto-resistance element has a structure in which an insulating layer is sandwiched between two magnetic layers.

18. A magnetic random access memory comprising:

a write word line;

bit lines crossing said write word line;

magneto-resistance elements which are placed one by one at intersections of said write word line and said bit lines and store data in accordance wit directions of magnetization that change depending on magnetic fields generated by a current flowing in said write word line and currents flowing in said bit lines; and a driver for causing said magneto-resistance element located at an intersection of said write word line and a selected first bit line of said bit lines to store data by making a current flow in said write word line in a first direction and making a current flow in said selected first bit line, and then making a current flow in said write word line in a second direction opposite to the first direction;

wherein a current is made to flow in a second bit line different from said selected first bit line in a period during which the current flows in said write word line in the second direction, thereby causing said magneto-resistance element located at an intersection of said write word line and said second bit line to store data.

19. The memory according to claim 18, wherein data write operation is completed for said magneto-resistance element located at the intersection of said write word line and said first or second bit line in one write cycle, and a direction of the current flowing in said write word line is changed for each write cycle.

20. The memory according to claim 18, wherein data write operation is completed for said magneto-resistance element located at the intersection of said write word line and said first or second bit line in one write cycle, and a direction of the current flowing in said first or second bit line is changed once within one write cycle.

21. The memory according to claim 18, wherein data to be written in said magneto-resistance element located at the intersection of said write word line and said first or second bit line is determined by a direction of the current flowing in said selected bit line.

22. The memory according to claim 4, wherein said magneto-resistance element has a structure in which an insulating layer is sandwiched between two magnetic layers.

23. A magnetic random access memory comprising:

a write word line;

a bit line crossing said write word line;

a magneto-resistance element which is placed at an intersection of said write word line and said bit line; and a driver for causing said magneto-resistance element to store data by making a current flow in said write word line in a first direction and a current flow in said bit line in a second direction or a direction opposite to the second direction, and then making a current flow in said write word line in a direction opposite to the first direction, wherein when the data is stored in said magneto-resistance element, the current in said word line flows only in the first direction.

* * * * *